United States Patent [19]

Na

[11] Patent Number: 5,955,685
[45] Date of Patent: Sep. 21, 1999

[54] SPUTTERING TARGET FOR FORMING MAGNETIC THIN FILM AND FABRICATION METHOD THEREOF

[75] Inventor: Jong Gab Na, Seoul, Rep. of Korea

[73] Assignee: Korea Institute of Science and Technology, Seoul, Rep. of Korea

[21] Appl. No.: 08/805,742

[22] Filed: Feb. 25, 1997

[30] Foreign Application Priority Data

Aug. 1, 1996 [KR] Rep. of Korea ................... 1996 32163

[51] Int. Cl.⁶ ..................................................... C22C 33/00
[52] U.S. Cl. ................................................. 75/235; 75/246
[58] Field of Search ....................................... 75/246, 235

[56] References Cited

U.S. PATENT DOCUMENTS

| | | |
|---|---|---|
| 4,217,151 | 8/1980 | Mitzuno et al. . |
| 4,999,260 | 3/1991 | Saito et al. . |
| 5,302,469 | 4/1994 | Sugenoya et al. . |
| 5,590,385 | 12/1996 | Paik .......................................... 419/10 |

FOREIGN PATENT DOCUMENTS

| | | |
|---|---|---|
| 1-144249 | 6/1989 | Japan . |
| 5-315180 | 11/1993 | Japan . |

*Primary Examiner*—Ngoclan Mai
*Attorney, Agent, or Firm*—Thelen, Reid & Priest

[57] ABSTRACT

A sputtering target for forming a magnetic thin film includes iron powder and at least one first oxide powder selected from the oxides of barium, strontium and lead. The fabrication method of a sputtering target for forming a magnetic thin film comprises the steps of molding a mixture comprising an iron-first oxide powder, or an iron-first and second oxide powder to form a compact by a cold hydrostatic pressing and of sintering the compact either in a vacuum or in a non-oxygen atmosphere. The sputtering target with a high thermal conductivity improves the deposition rate by a raised input voltage.

3 Claims, No Drawings

5,955,685

SPUTTERING TARGET FOR FORMING MAGNETIC THIN FILM AND FABRICATION METHOD THEREOF

BACKGROUND OF THE INVENTION

1. Field of the Invention

The present invention relates to a sputtering target for forming a magnetic thin film and a fabrication method for the same, and more particularly to a sputtering target for forming a magnetic thin film and a fabrication method for the same for providing a magnetoplumbite thin film which is applicable to either magnetic devices such as a floppy disk, a hard disk and a magnetic tape, or a thin film inductor.

2. Description of the Prior Art

A magnetoplumbite thin film composed of a magnetic material has a structural formula of $MO \cdot 6Fe_2O_3$ (here, M denotes Ba, Sr or Pb) and is known as a prospective high density magnetic recording material with a high coercive force resulting from a high crystalline magnetic anisotropy. Additionally, it has a chemical stability characteristic and improved corrosion resistance, and accordingly is applicable to a variety of fields for its magnetic, optical and electrical properties depending on the composition and the structure thereof.

An oxide thin film is formed using techniques such as a vacuum deposition, an electro-plating, a chemical vapor deposition, and a sputtering, among which the sputtering technique is relatively popular because it facilitates the controlling of its fine components and is appropriate to mass production.

In the sputtering technique used for to forming a thin film with a high melting point, mainly an argon gas is employed to ion-collide against a metallic or compound target and thus to emit target-composing elements by a mechanical momentum applied thereto, and finally to form a thin film on which the particles emitted therefrom are deposited. Therefore, the coated thin film depends largely upon the property of the sputtering target.

Japanese Laid-Open Patent Publication 5-315180 discloses a method for forming an oxide target without abnormal sparking, wherein a high density barium ferrite ($BaO \cdot 6Fe_2O_3$) compact to serve as a target is prepared using a cold hydrostatic pressing method and then annealed in an atmosphere including oxygen.

Also, in Japanese Patent No. 1-144249, a Heusler's alloy thin film is stacked on a magnetoplumbite ferrite thin film to form an optical magnetic recording media by using an oxide target made by pulverizing, powder-compressing and sintering a powder made of from $BaCO_3$, $Fe_2O_3$ and $TiO_2$.

However, when sputtering an oxide thin film by using an oxide target serving generally as a non-conductor, an alternating current must be used and also the deposition speed remains relatively low at about 50 Å/min. Besides, a raised input electric current for a higher deposition speed may result in a fragility of the target.

The above disadvantages are attributable to low thermal conductivity and high brittleness. For instance, the thermal conductivity constant of barium ferrite at a normal temperature stays at 0.04 W/cm K, that is, about one twentieth as high as that of iron which is at 0.803 W/cm.K, so that the target can easily become brittle because the heat occurring when the sputtering gas is ion-collided against the target concentrates mainly on the target surface.

To overcome the target embrittling problem and raise the deposition rate of an oxide, the present invention employs a reactive sputtering method applying argon and oxygen to a sputtering gas using a metallic target which was prepared by casting ion-barium alloy in the ratio of 12:1.

However, barium with a high oxidation property is easily oxidized and the slag drifting on the fusing liquid serves to change the composition. Also, the changed amount depends on dissolving conditions, thereby making it difficult to form an alloy with an exact composition. In particular, it is difficult to control the exact additional amount of Ti, Co, Si and Mn, each of which serves as an addition agent, wherein less than ten percent of each of the addition agents are added thereto for thereby improving the magnetic property of the thin film.

SUMMARY OF THE INVENTION

Therefore, it is an object of the present invention to provide a sputtering target with a higher thermal conductivity which makes it possible to improve the deposition rate under an increased input voltage It is an another object of the present invention to provide a sputtering target for exactly controlling the target components by precisely adding an addition agent to improve the magnetic property of thin film.

It is a further object of the present invention to provide a fabrication method for a sputtering target.

To achieve the above-described objects and to solve the conventional disadvantages, there is provided a compound target composed of an iron powder and an oxide material, wherein at least one oxide powder of barium, strontium and lead is appropriately mixed with an iron powder, molded and sintered in an argon or hydrogen atmosphere, that is, a non-oxidation atmosphere.

The sputtering target for forming a magnetic thin film according to the present invention comprises an iron powder and at least one first oxide powder selected from oxide materials of barium, strontium and lead, wherein the compound ratio of iron powder to the first oxide powder ranges from 11:1 to 13:1.

The present invention also provides a sputtering target for forming a magnetic thin film, comprising an iron powder, at least one first oxide powder selected from oxide materials of barium, strontium and lead and at least one second oxide powder selected from oxide of titanium, cobalt, silicon and manganese, wherein the addition amount of the second oxide powder is not more than that of the first oxide powder.

Further, the fabrication method of a sputtering target for forming a magnetic thin film comprises the steps of molding a mixture comprising an iron-first oxide powder, or iron-first and second oxide powder by a cold hydrostatic pressing to form a compact, and sintering the compact either in a vacuum or in a non-oxygen atmosphere such as hydrogen or argon atmosphere.

Still further, the fabrication method of a sputtering target for forming a magnetic thin film comprises the steps of molding a mixture comprising an iron-first oxide powder, or iron-first oxide and second oxide powders to form a compact, by cold hydrostatic pressing at a pressure of not less than 0.3 ton/cm$^2$, and of applying hot hydrostatic pressing to the compact at a pressure of not less than 0.2 ton/cm$^2$.

DETAILED DESCRIPTION OF THE PRESENT INVENTION

With reference to the following examples, the present invention will now be described but is not confined to the conditions given for the respective examples.

EXAMPLE 1

Iron powder and lead powder were weighed to have an atomic ratio of 11 to 1 and mixed in a ball mill for ten hours using an ethyl alcohol as a milling liquid. The mixed powder was compacted by cold hydrostatic pressing at a pressure of 0.5 ton/cm$^2$. The compact was sintered in an argon atmosphere at a temperature of 1300° C. for five hours, thereby manufacturing a target mixed of iron and lead oxides. The target sintered was machined to 60 mm$^\Phi$×5 mm$^T$, mounted on a facing-target sputtering unit, and deposited on a surface thermal-oxidized silicon single crystal phase by using a sputtering gas of 50%Ar+O$_2$ and a direct current of 0.5 A 600V, and heated at a temperature of 600° C. The magnetic property of the magnetic thin film was measured by a vibrating sample magnetometer and the thickness of the thin film was measured by a stylus profiler. The resultant values are shown in Table 1.

EXAMPLE 2

Iron powder and strontium powder were weighed to have an atomic ratio of 12 to 1 and mixed in a ball mill for ten hours using an ethyl alcohol serving as a milling liquid. The mixed powder was compacted by cold hydrostatic pressing at a pressure of 0.3 ton/cm$^2$. The compact was sintered in an argon atmosphere at a temperature of 1300° C. for five hours, thereby manufacturing a target mixed with iron and strontium oxides. The target was machined to 60 mm$^\Phi$×5 mm$^T$, mounted on a facing-target sputtering unit, and deposited on a surface thermal-oxidized silicon single crystal phase by using a sputtering gas of 50%Ar+O$_2$ and a direct current of 0.5 A 600V, and heated at a temperature of 600° C. The magnetic property of the magnetic thin film was measured by a vibrating sample magnetometer and the thickness of the thin film by a stylus profiler. The resultant values are shown in Table 1.

EXAMPLE 3

Iron, strontium, titanium oxide and cobalt oxide powders were weighed to have anatomic ratio of 12:1:0.5:0.5 and mixed in a ball mill for ten hours using an ethyl alcohol as a milling liquid. The mixed powder was compacted by cold hydrostatic pressing at a pressure of 0.3 ton/cm$^2$. The compact was sintered in a vacuum atmosphere of 2×10$^{-4}$torr at a temperature of 1300° C. for five hours, thereby manufacturing a target mixed with iron, strontium, titanium oxide and cobalt oxide. The target was machined to 60 mm$^\Phi$×5 mm$^T$, mounted on a facing-target sputtering unit, and deposited on a surface thermal-oxidized silicon single crystal phase by using a sputtering gas of 50%Ar+O$_2$ and an input voltage of 300 W R.F., and heated at a temperature of 600° C. The magnetic property of the magnetic thin film was measured by a vibrating sample magnetometer and the thickness of the thin film by a stylus profiler. The resultant values are shown in Table 1.

EXAMPLE 4

Iron, barium oxide, titanium oxide and manganese oxide powders were weighed to have an atomic ratio of 11:1:0.5:0.5 and mixed in a ball mill for ten hours using an ethyl alcohol as a milling liquid. The mixed powder was compacted by cold hydrostatic pressing at a pressure of 0.5 ton/cm$^2$. The compact was sintered in a vacuum atmosphere of 2×10$^{-4}$torr at a temperature of 1300° C. for five hours, there by manufacturing a target mixed with iron, barium oxide, titanium oxide and cobalt oxide. The target was machined to 60 mm$^\Phi$×5mm$^T$, mounted on a facing-target sputtering unit, and deposited on a surface thermal-oxidized silicon single crystal phase by using a sputtering gas of 50%Ar+O$_2$ and an input voltage of 300 W R.F., and heated at a temperature of 600° C. The magnetic property of the magnetic thin film was measured by a vibrating sample magnetometer and the thickness of the thin film by a stylus profiler. The resultant value is shown in Table 1.

EXAMPLE 5

Iron and lead oxide powders were weighed to have an atomic ratio of 13 to 1 and mixed in a ball mill for ten hours using an ethyl alcohol as a milling liquid. The mixed powder was compacted by cold hydrostatic pressing at a pressure of 0.5 ton/cm$^2$. The compact was sintered in an argon atmosphere at a temperature of 1300° C. for five hours, thereby manufacturing a target mixed with iron and lead oxide. The target was machined to 60 mm$^\Phi$×5 mm$^T$, mounted on a facing-target sputtering unit, and deposited on a surface thermal-oxidized silicon single crystal phase by using a sputtering gas of 50%Ar+O$_2$ while varying the input R.F. voltage from300 W to 600 W by 100 W, and heated at a temperature of 600° C. The thickness of the thin film was measured by a stylus profiler. The resultant value is shown in Table 2.

Comparative Example 1

Iron oxide, barium oxide, titanium oxide and manganese oxide powders were weighed to have an atomic ratio of 11:1:0.5:0.5 and mixed in a ball mill for ten hours using ethyl alcohol as a milling liquid. The mixed powder was compacted by cold hydrostatic pressing at a pressure of 0. 5 ton/cm$^2$. The compact was sintered in a normal atmosphere at a temperature of 1300° C. for five hours, thereby manufacturing a target mixed with iron oxide, barium oxide, titaniumoxide and manganese oxide. The target was machined to 60 mm$^\Phi$×5 mm$^T$, mounted on a facing-target sputtering unit, and deposited on a surface thermal-oxidized silicon single crystal phase by using a sputtering gas of 50%Ar+O$_2$ and an input voltage of 300 W R.F., and heated at a temperature of 600° C. The magnetic property of the magnetic thin film was measured by a vibrating sample magnetometer and the thickness of the thin film by a stylus profiler. The resultant values are shown in Table 1.

Comparative Example 2

Iron and lead oxide powders were weighed to have an atomic ratio of 12 to 1 and mixed in a ball mill for ten hours using an ethyl alcohol as a milling liquid. The mixed powder was compacted by cold hydrostatic pressing at a pressure of 0.3 ton/cm$^2$ and then by hot hydrostatic pressing at a pressure of 0.2 ton/cm$^2$ at a temperature of 600° C., there by manufacturing a target of mixed with iron oxide barium oxide. The target was machined to 60 mm$^\Phi$×5mm$^T$, mounted on a facing-target sputtering unit, and deposited on a surface thermal-oxidized silicon single crystal phase by using a sputtering gas of 50% Ar+O$_2$ while varying an R.F. input voltage from 300 W to 600 W by 100 W step and heated at a temperature of 600° C. The thickness of the thin film was measured by a stylus profiler. The resultant value is shown in Table 2.

TABLE 1

|  | Magnetic Property | | Deposition Rate (Å/min) |
|---|---|---|---|
|  | Saturated Magnetization (emu/cc) | Coercive Force (Oe) |  |
| Exp. 1 | 265 | 1560 | 250 |
| Exp. 2 | 308 | 2350 | 240 |
| Exp. 3 | 297 | 1850 | 240 |
| Exp. 4 | 283 | 1750 | 260 |
| Com. Exp. 1 | 278 | 1680 | 50 |

TABLE 2

|  | Deposition Rate (Å/min) | | | | Target State | | | |
|---|---|---|---|---|---|---|---|---|
|  | 300 W | 400 W | 500 W | 600 W | 300 W | 400 W | 500 W | 600 W |
| Exp. 5 | 240 | 330 | 410 | 500 | no brittle | no brittle | no brittle | no brittle |
| Com. Exp. 2 | 50 | 60 |  |  | no brittle | partial cracking | brittled | brittled |

*A satisfactory thin film was not obtained due to the brittleness of the target during sputtering.

As shown in Tables 1 and 2, when the magnetoplumbite thin film is formed by a sputtering method, the deposition rate rises more significantly in the present invention than in the case where the conventional metal oxide target is applied, thereby obtaining a higher quality magnetic thin film. Also, during increasing the input voltage, the fragility problem, which is due to heat concentration arising from the collision of sputtering gas ions against the target, is prevented.

To raise the final target concentration, hot hydrostatic pressing accompanying cold hydrostatic pressing is applied in the present invention, so that when forming the target by the cold hydrostatic pressing, the pressure is held at more than 0.3 ton/cm$^2$, and the pressure under the hot hydrostatic pressing is preferably held at 0.2 ton/cm$^2$ under a temperature of 600° C.

What is claimed is:

1. A sputtering target for forming a magnetic thin film, comprising an iron powder and at least one first oxide powder selected from oxides of barium, strontium and lead.

2. The target as recited in claim 1, wherein the compound ratio of iron powder to the first oxide powder ranges from 11:1 to 13:1.

3. The target as recited in claim 1, further comprising the second oxide powder selected from the oxides of titanium, cobalt, silicon and manganese wherein the addition amount of the second oxide is not more than that of the first oxide.

* * * * *